United States Patent
Huang et al.

(10) Patent No.: US 11,996,227 B2
(45) Date of Patent: *May 28, 2024

(54) HEXAGONAL SEMICONDUCTOR PACKAGE STRUCTURE

(71) Applicant: Taiwan Semiconductor Manufacturing Company, Ltd., Hsinchu (TW)

(72) Inventors: Tzu-Sung Huang, Tainan (TW); Chen-Hua Yu, Hsinchu (TW); Hao-Yi Tsai, Hsinchu (TW); Hung-Yi Kuo, Taipei (TW); Ming Hung Tseng, Toufen Township (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/065,199

(22) Filed: Dec. 13, 2022

(65) Prior Publication Data

US 2023/0116861 A1   Apr. 13, 2023

Related U.S. Application Data

(60) Continuation of application No. 16/734,776, filed on Jan. 6, 2020, now Pat. No. 11,532,425, which is a (Continued)

(51) Int. Cl.
*H01F 27/28* (2006.01)
*H01F 38/14* (2006.01)
*H01F 41/04* (2006.01)
*H01F 41/10* (2006.01)
*H01L 49/02* (2006.01)
*H02J 50/10* (2016.01)
*H02J 50/80* (2016.01)
*H01F 17/00* (2006.01)

(52) U.S. Cl.
CPC ......... *H01F 27/2804* (2013.01); *H01F 38/14* (2013.01); *H01F 41/041* (2013.01); *H01F 41/10* (2013.01); *H01L 28/10* (2013.01); *H02J 50/10* (2016.02); *H02J 50/80* (2016.02); *H01F 2017/0086* (2013.01)

(58) Field of Classification Search
CPC ...... H01F 27/2804; H01F 38/14; H02J 50/10; H02J 50/80; H02J 7/025; H02J 50/005; H01L 28/10; H01L 23/5227
See application file for complete search history.

(56) References Cited

U.S. PATENT DOCUMENTS 6,774,470 B2 * 8/2004 Yagi ................. G06K 19/07749
257/679
2007/0166954 A1   7/2007 Yamazaki et al.
(Continued)

*Primary Examiner* — Hal Kaplan
*Assistant Examiner* — Rasem Mourad
(74) *Attorney, Agent, or Firm* — Slater Matsil, LLP

(57) ABSTRACT

Coil structures and methods of forming are provided. The coil structure includes a substrate. A plurality of coils is disposed over the substrate, each coil comprising a conductive element that forms a continuous spiral having a hexagonal shape in a plan view of the coil structure. The plurality of coils is arranged in a honeycomb pattern, and each conductive element is electrically connected to an external electrical circuit.

20 Claims, 13 Drawing Sheets

Related U.S. Application Data division of application No. 15/232,443, filed on Aug. 9, 2016, now Pat. No. 10,530,175.

(56) References Cited

U.S. PATENT DOCUMENTS

| | | | |
|---|---|---|---|
| 2009/0096413 A1* | 4/2009 | Partovi | H01F 27/2804 |
| | | | 320/108 |
| 2010/0068864 A1 | 3/2010 | Hopper et al. | |
| 2010/0180430 A1* | 7/2010 | Roskos | H01F 41/045 |
| | | | 29/602.1 |
| 2011/0025443 A1 | 2/2011 | Hopper et al. | |
| 2011/0291231 A1* | 12/2011 | Jiang | H01L 28/10 |
| | | | 257/E21.705 |
| 2012/0286429 A1 | 11/2012 | Han et al. | |
| 2013/0087916 A1* | 4/2013 | Lin | H01L 24/11 |
| | | | 257/738 |
| 2013/0241308 A1 | 9/2013 | Bilbrey et al. | |
| 2013/0293337 A1* | 11/2013 | Lo | H01F 41/041 |
| | | | 336/200 |
| 2015/0162744 A1 | 6/2015 | Liu et al. | |
| 2015/0170830 A1* | 6/2015 | Miyamoto | H02J 50/90 |
| | | | 307/104 |
| 2015/0214748 A1* | 7/2015 | Lin | H02J 50/10 |
| | | | 307/104 |
| 2015/0323301 A1 | 11/2015 | Zhe et al. | |
| 2016/0212853 A1 | 7/2016 | Kang | |
| 2017/0221820 A1 | 8/2017 | Yu et al. | |
| 2018/0241251 A1* | 8/2018 | Nomura | B60L 53/39 |

\* cited by examiner

HEXAGONAL SEMICONDUCTOR PACKAGE STRUCTURE

PRIORITY CLAIM AND CROSS-REFERENCE

This application is a continuation of U.S. patent application Ser. No. 16/734,776, filed on Jan. 6, 2020, entitled "Hexagonal Semiconductor Package Structure," which is a divisional of U.S. patent application Ser. No. 15/232,443, filed on Aug. 9, 2016, now U.S. Pat. No. 10,530,175 issued Jan. 7, 2020, entitled "Hexagonal Semiconductor Package Structure," each application is hereby incorporated herein by reference.

BACKGROUND

Wireless charging has become an increasingly popular charging technology. Wireless charging is sometimes known as inductive charging, which uses an electromagnetic field to transfer power between a power transmitter and a power receiver. The power is sent through inductive coupling to an electrical device, which can then use that power to charge batteries or run the device. Induction chargers use a first induction coil to create an alternating electromagnetic field from the transmitter and a second induction coil to receive the power from the electromagnetic field. The second induction coil converts the power back into electric current, which is then used to charge a battery or directly drive electrical devices. The two induction coils, when proximal to each other, form an electrical transformer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
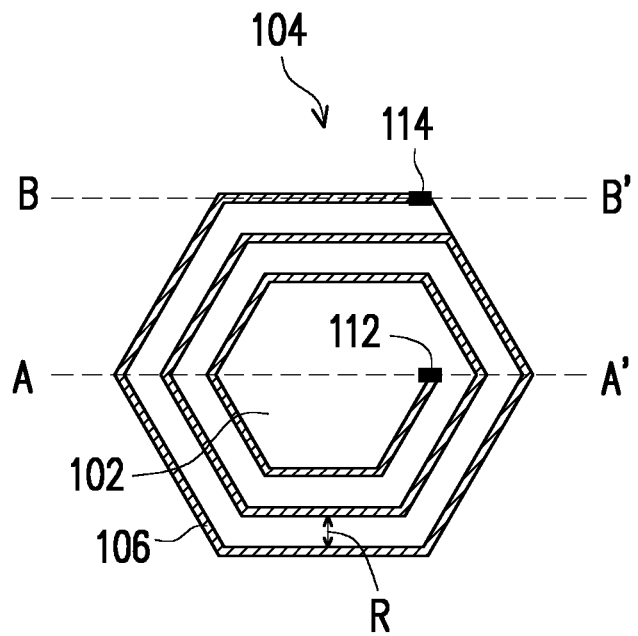
FIGS. 1A and 1B are plan views of a coil structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/o r letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Coil structures and the methods of forming the same are provided in accordance with various exemplary embodiments. The intermediate stages of forming the coil structures are illustrated in accordance with some embodiments. Some variations of some embodiments are discussed. Throughout the various views and illustrative embodiments, like reference numbers are used to designate like elements.

Figure 1B:
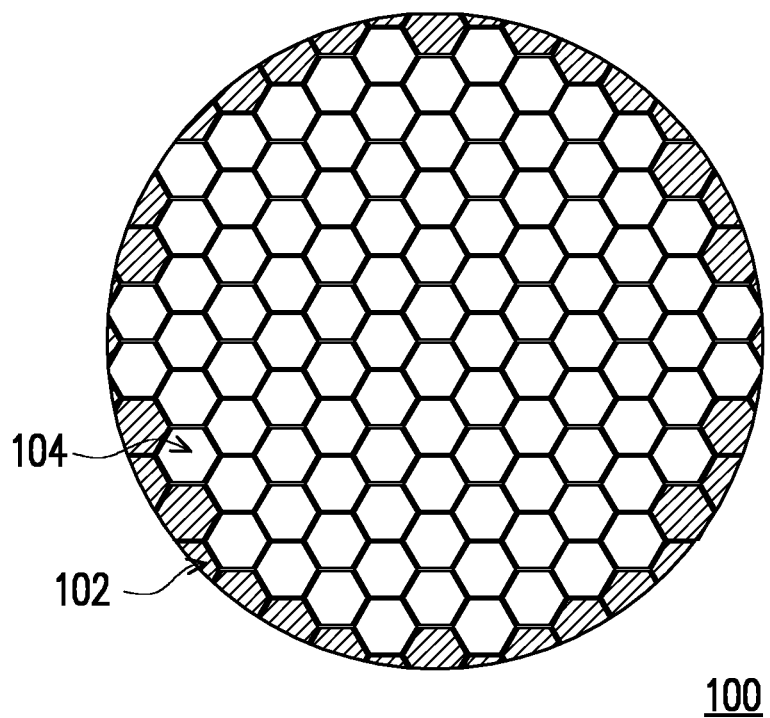

FIGS. 1A and 1B illustrate planar views of coil structure 100, which comprises a plurality of coils 104. As shown in FIG. 1B, a wafer 102 comprises a plurality of coils 104 on a top surface of wafer 102. As shown in FIG. 1A, each coil 104 comprises a conductive element 106 that is arranged in continuous spiral coil. The conductive element 106 is connected to an external electrical circuit at a first end by electrical connector 112 and a second end by electrical connector 114. The conductive element 106 may define the shape of each coil 104. In some embodiments, as shown in FIGS. 1A and 1B, each coil 104 may have a hexagonal shape. In some embodiments, as shown in FIG. 1A, the plurality of coils 104 may be arranged on the top surface of wafer 102 in a symmetric array, such as a honeycomb pattern, in which sidewalls of adjacent coils 104 are aligned with each other. In some embodiments, the honeycomb patterns of coils 104 may cover over 91% of the surface of wafer 102. In some embodiments, conductive element 106 of each coil is formed a minimum distance from conductive element 106 of an adjacent coil. In some embodiments, the minimum distance is about 200 μm to about 250 μm, such as about 220 μm.

In some embodiments, coil structure 100 may be used in connection with wireless charging. For example, coil structure 100 may generate a magnetic field which, when applied to a receiving coil structure, is converted into electrical energy for charging a battery. In some embodiments, the use of a plurality of coils 104 in structure 100, instead of a single coil 104, may enable the magnetic field that is created to be focused in a desired direction, which may enable more efficient wireless charging. In some embodiments, the use of a hexagonal coil shape, and arranging the plurality of coils 104 in a honeycomb pattern, may allow for a larger surface of the wafer 102 to be covered with coils 104 and may enable a larger number of coils to be disposed in wafer 102. In some embodiments, an increased number of coils 104 on the top surface of wafer 102 may enable more efficient wireless charging.

In some embodiments, each coil 104 is a same or similar size to other coils 104. As shown in FIG. 1, each coil 104 may have a hexagonal shape having six sides. The dimensions of each coil 104 may be determined in part by a size of wafer 102. In some embodiments, the top surface of wafer 102 may have a length of about 15 mm to about 20 mm, such as about 15 mm, and a width of about 15 mm to about 20 mm, such as about 15 mm. For example, wafer 102 may be comprised in a package having a top surface with a surface area of about 15×15 mm$^2$ to 20×20 mm$^2$. Each coil 104 may have a length of about 50 µm to about 200 µm, and each coil 104 may have a width of about 100 µm to about 200 µm.

As shown in FIG. 1A, conductive element 106 forms a continuous conductive line that extends along the top surface of wafer 102 and winds into continuous, regularly spaced rings that are hexagonal in shape. Although a particular number of rings are depicted in FIG. 1A, each coil 104 may have more rings or fewer rings than the embodiment depicted in FIG. 1A. Each coil 104 may have a same number of rings as the other coils 104 in coil structure 100, or coil structure 100 may comprise coils 104 that have different numbers of rings from other coils 104. In some embodiments, each ring of conductive element 106 may be formed a distance R from an adjacent ring of the same conductive element 106. In some embodiments, R may be about 150 µm to about 100 µm, such as about 100 µm.

Figure 2:
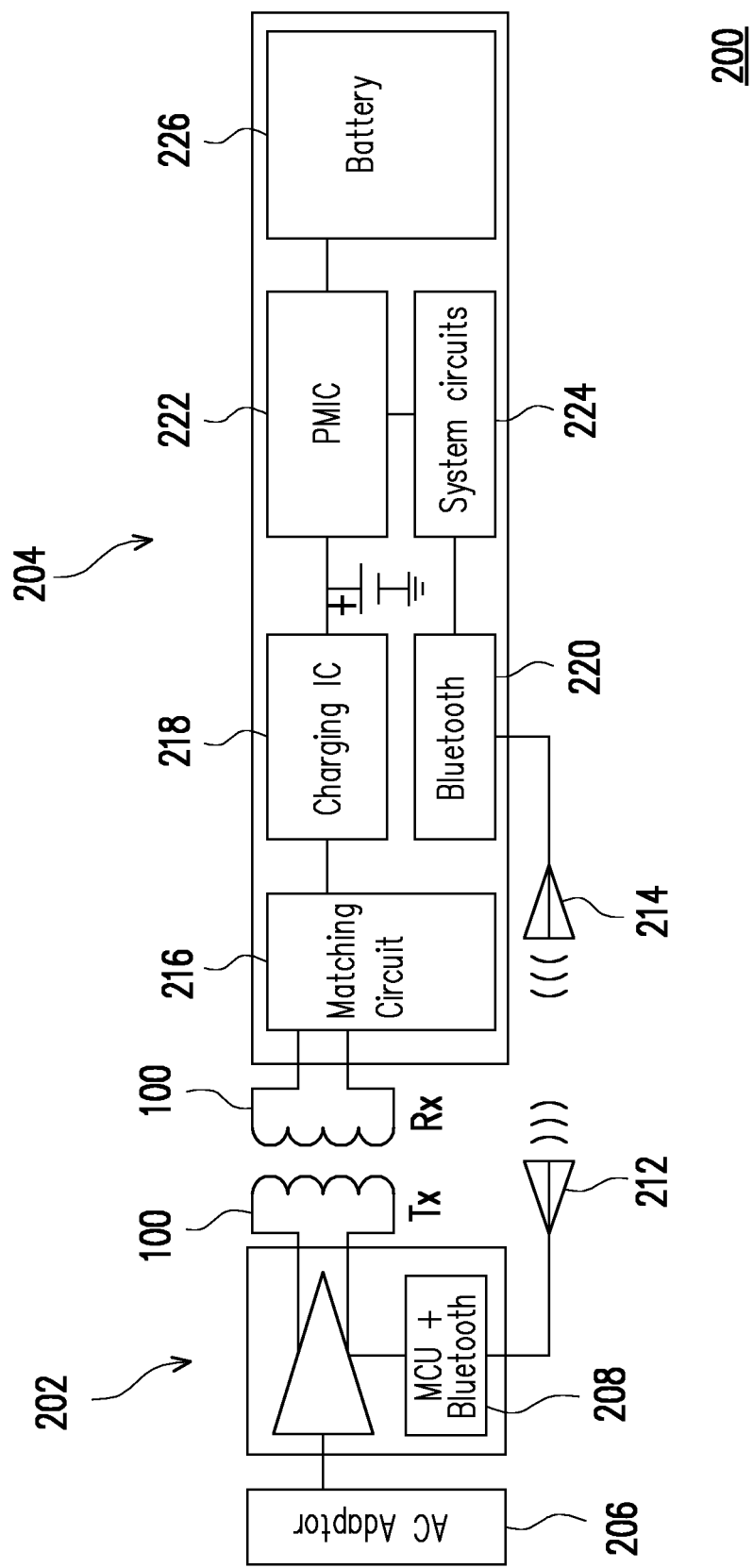
FIG. 2 is a schematic of a wireless charging circuit in accordance with some embodiments.

FIG. 2 illustrates a circuit diagram of an exemplary wireless charging circuit 200 including the coil structure 100 as shown in FIGS. 1A through 1B in accordance with some embodiments. In the embodiment depicted in FIG. 2 coil structure 100 as depicted in FIGS. 1A and 1B is used as both a transmitting coil and a receiving coil. In some embodiments, coil structure 100 may be used as only a receiving coil structure and a different coil structure may be used as a transmitting coil structure. In some embodiments, coil structure 100 may only be used as a transmitting coil structure and a different coil structure may be used as a receiving coil structure.

Wireless charging circuit 200 includes power-transmitting circuit 202 for transmitting power, and power-receiving circuit 204 for receiving power. Power-transmitting circuit 202 includes AC adapter 206, Microcontroller (MCU) and Bluetooth circuit 208, power-transmitting (TX) coil structure 100, and Bluetooth signal antenna 212. Power-receiving circuit 204 includes Bluetooth signal antenna 214, power-receiving coil structure 100, matching circuit 216, charging Integrated Circuit (IC) 218, Bluetooth circuit 220, Power Management Integrated Circuit (PMIC) 222, System Circuits 224, and battery 226. It is appreciated that the illustrated wireless charging circuits are examples, and all other wireless charging circuits having different design are within the scope of the present disclosure.

In accordance with some exemplary embodiments, AC adapter 206 provides power to power-transmitting (TX) coil structure 100. MCU and Bluetooth circuit 208 may negotiate with Bluetooth circuit 220, for example, to determine the power and the timing of the power transmission, Bluetooth signals for the negotiation are sent and received through antennas 212 and 214. For example, through the negotiation, wireless power may be sent when the distance between power-transmitting circuit 202 and power-receiving circuit 204 is lower than a pre-determined threshold, and/or when the stored power in battery 226 is lower than a pre-determined threshold level.

When it is determined that power should be transmitted, power-transmitting circuit 202 starts transmitting power, which may be in the form of magnetic field at a high frequency, for example, at about 6.78 MHz. The power is transmitted through transmitting coil structure 100. Receiving coil structure 100 receives the power, and feeds the respective currents to charging IC 218, which includes an AC-DC converter. PMIC 222 may have the function of DC to DC conversion, battery charging, linear regulation, power sequencing and other miscellaneous system power functions. System circuits 224 handle logic functions. The converted power is charged to battery 226.

Figure 3:
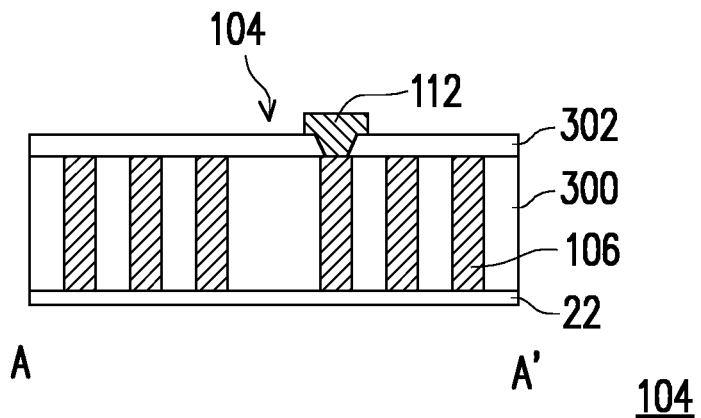
FIGS. 3 and 4 are cross section views of a coil structure in accordance with some embodiments.

Referring to FIG. 3, a cross sectional diagram of a coil 104 is depicted. The cross sectional view of FIG. 3 is taken along the line A-A' in FIG. 1. As shown in FIG. 3, coil 104 comprises conductive element 106 disposed in an encapsulating material 300. Encapsulating material 300 is formed of molding compounds, molding underfills, epoxies, resins, or the like.

Dielectric layer 302 is disposed over the encapsulating material 300. Dielectric layer 302 may be used as a passivation layer to isolate the underlying metallic features from the adverse effect of moisture and other detrimental substances. Dielectric layer 302 may be formed of a polymer, which may also be a photo-sensitive material such as polybenzoxazole (PBO), polyimide, benzocyclobutene (BCB), or the like. In some embodiments, dielectric layer 302 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like.

Dielectric layer 22 is disposed under the encapsulating material 300. Dielectric layer 22 may be used as a passivation layer to isolate the underlying metallic features from the adverse effect of moisture and other detrimental substances. Dielectric layer 22 may also be formed of a polymer, which may also be a photo-sensitive material such as polybenzoxazole (PBO), polyimide, benzocyclobutene (BCB), or the like. In some embodiments, dielectric layer 22 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 22 may comprise a same material as dielectric layer 302, or dielectric layer 22 may comprise materials that are different from dielectric layer 302.

Electrical connector 112 is formed at the top surface of coil 104. Electrical connector 112 connects coil 104 to an external electrical circuit. Electrical connector 112 may be an Under-Bump Metallurgy (UBM), a metal pad, a metal pillar, or the like, and may or may not include solder regions.

Figure 4:
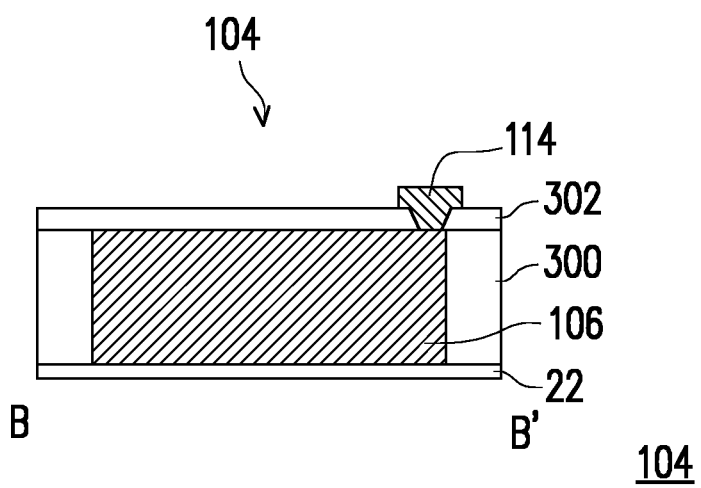

Referring to FIG. 4, another cross sectional diagram of a coil 104 is depicted. The cross sectional view of FIG. 4 is taken along the line B-B' in FIG. 1. As shown in FIG. 4, coil 104 comprises conductive element 106 disposed in the encapsulating material 300. Along the line B-B', conductive element extends in a straight line and forms a sidewall of the coil 104. Dielectric layer 302 is disposed over the encapsulating layer 300. Electrical connector 114 is formed at the top surface of coil 104. Electrical connector 114 connects coil 104 to an external electrical circuit. Electrical connector 114 may be an Under-Bump Metallurgy (UBM), a metal pad, a metal pillar, or the like, and may or may not include solder regions.

Figure 5:
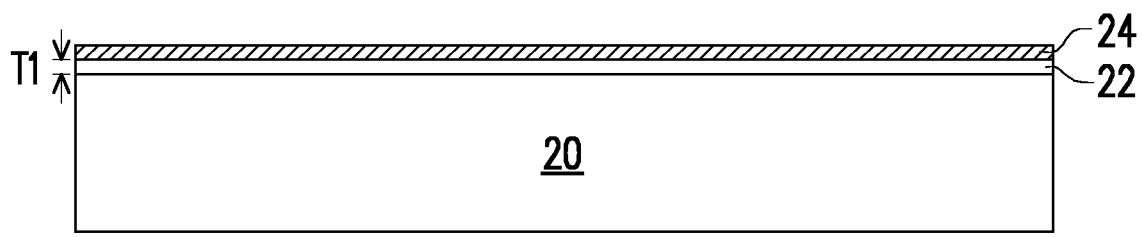
FIGS. 5, 6A and 6B, 7A and 7B, 8A and 8B, 9A and 9B, 10A and 10B, 11A and 11B, 12A and 12B, and 13A and 13B, are cross sectional diagrams of a coil in intermediate stages of forming a coil structure in accordance with some embodiments.

FIGS. 5-13 depict intermediate steps in the formation of a coil 104 as depicted in FIGS. 1A and 1B. FIG. 5 depicts carrier 20 and dielectric layer 22 formed over carrier 20. Carrier 20 may be a glass carrier, a ceramic carrier, or the like. Carrier 20 may have a round top-view shape, and may have a size of a silicon wafer. There may be a release layer (not shown) over carrier 20, wherein the release layer may be formed of Light To Heat Conversion (LTHC) coating.

The LTHC coating may be removed along with carrier 20 from the overlying structures that will be formed in subsequent steps.

In accordance with some embodiments of the present disclosure, dielectric layer 22 is formed over the release layer. As discussed above, dielectric layer 22 may be used as a passivation layer to isolate the overlying metallic features from the adverse effect of moisture and other detrimental substances. Dielectric layer 22 may be formed of a polymer, which may also be a photo-sensitive material such as polybenzoxazole (PBO), polyimide, benzocyclobutene (BCB), or the like. In accordance with alternative embodiments of the present disclosure, dielectric layer 22 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 22 may be formed, for example, by spin coating, lamination, Chemical Vapor Deposition (CVD), or the like. In some embodiments, dielectric layer 22 is a planar layer having a uniform thickness, wherein the thickness T1 may be between about 5 μm and about 10 μm. The top and the bottom surfaces of dielectric layer 22 are also planar.

Seed layer 24 is formed over dielectric layer 22, for example, through Physical Vapor Deposition (PVD). Seed layer 24 may be formed of copper, aluminum, titanium, or multi-layers thereof. In accordance with some embodiments of the present disclosure, seed layer 24 includes a titanium layer (not separately shown) and a copper layer (not separately shown) over the titanium layer. In accordance with alternative embodiments, seed layer 24 includes a single copper layer.

In some embodiments, a plurality of coils 104 is formed on carrier substrate 20. FIGS. 6-11 depict intermediate stages in the formation of a plurality of coils 104 on a single carrier substrate 20. FIGS. 6A, 7A, 8A, 9A, 10A, 11A, 12A and 13A are cross sectional drawings that depict intermediate stages of forming a coil 104, and are taken along the line A-A' of FIG. 1. FIGS. 6B, 7B, 8B, 9B, 10B, 11B, 12B, 13B are also cross sectional drawings that depict intermediate stages of forming a coil 104, and are taken along the line B-B' of FIG. 1.

Figure 6A:
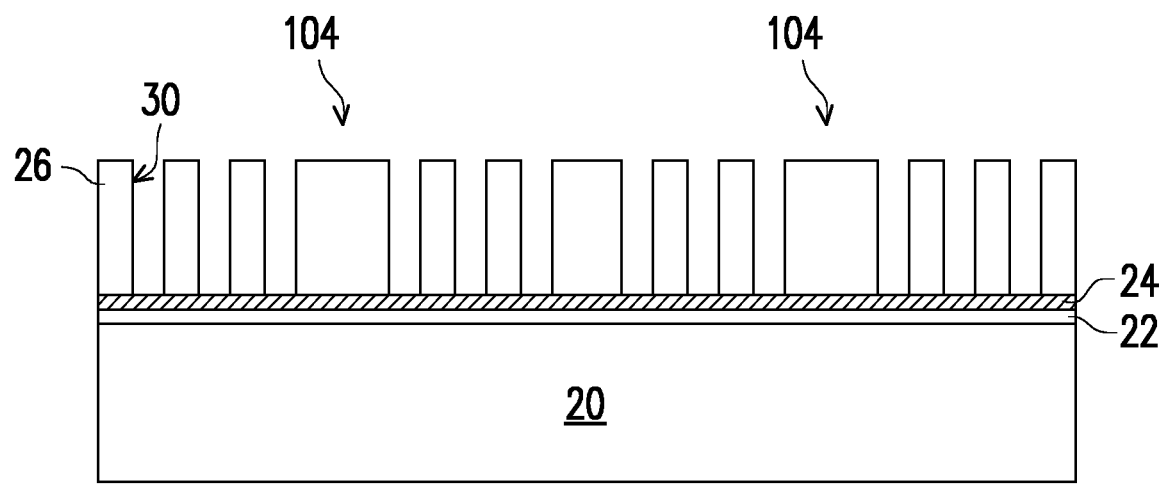
Figure 6B:
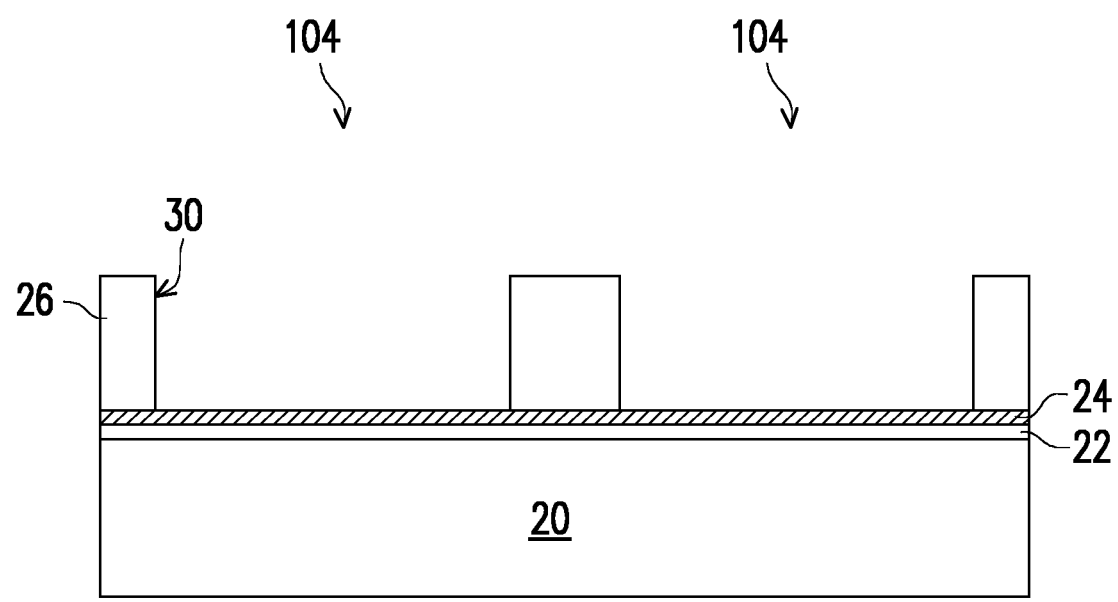

Referring to FIGS. 6A and 6B, photo resist 26 is formed over seed layer 24, and is patterned to from openings 30. As can be seen from FIG. 6A, along the line A-A' of FIG. 1A, a plurality of openings 30 are formed in photoresist 26 for each coil 104. FIG. 6B shows that, along the line B-B' of FIG. 1A, a single opening 30 is formed in photoresist 26 for each coil 104. In a top view of FIGS. 6A and 6B, openings 30 form a plurality of spirals, each coil 104 that is being formed corresponding to a separate spiral.

Figure 7A:
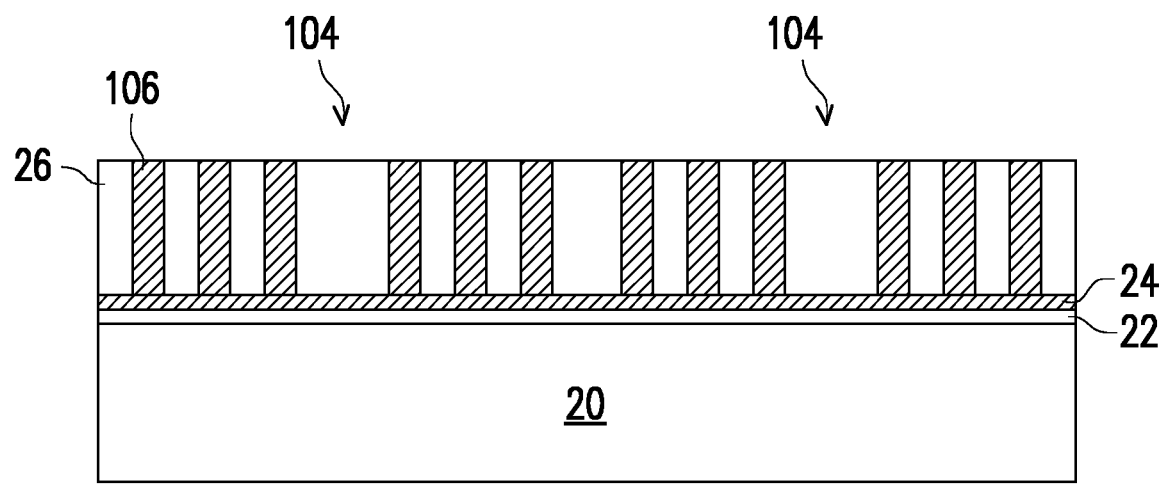
Figure 7B:
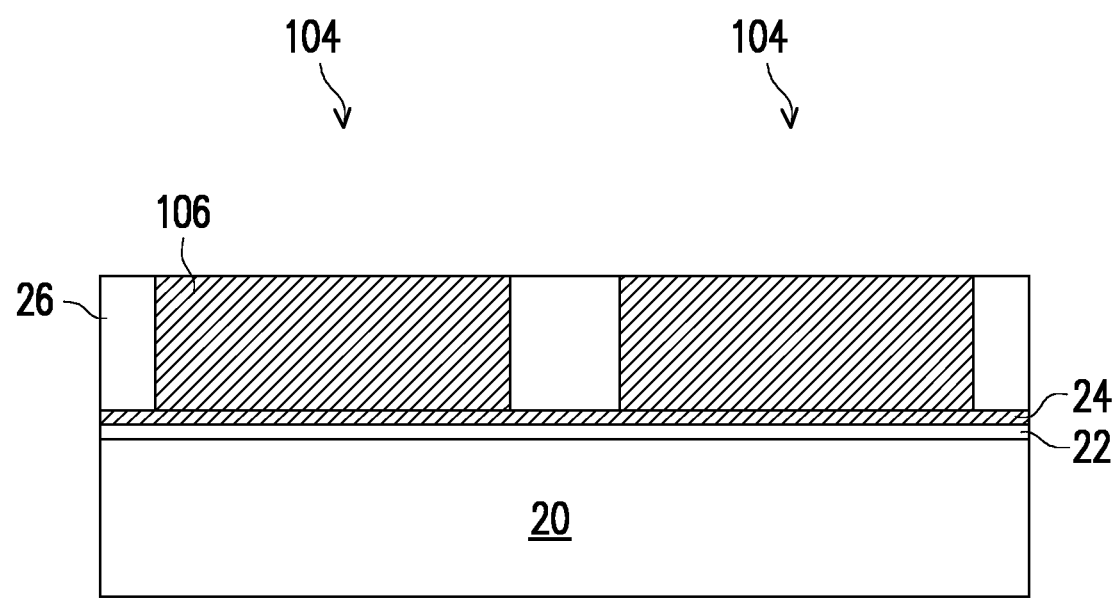

FIGS. 7A and 7B illustrate the formation of the plurality of coils 104, which includes plating a metallic material in openings 30 (FIGS. 6A and 6B) and over seed layer 24. Coils 104 may include copper, aluminum, tungsten, nickel, or alloys thereof. As shown in FIG. 7A, along the line A-A' of FIG. 1A, in each coil 104 the conductive element 106 passes through the line A-A' a plurality of times. As shown in FIG. 7B, along the line B-B' of FIG. 1A, conductive element 106 is an elongated metal structure that forms a sidewall of coil 104.

Figure 8A:
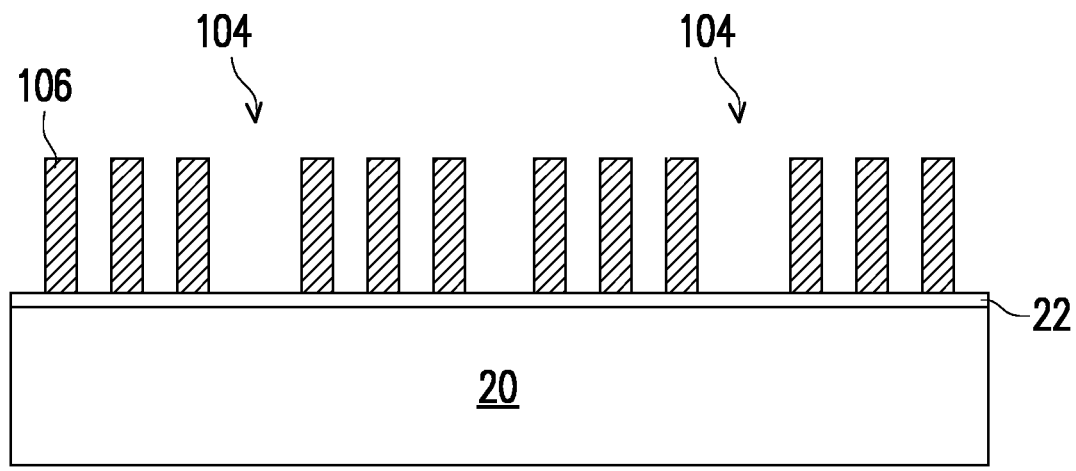
Figure 8B:
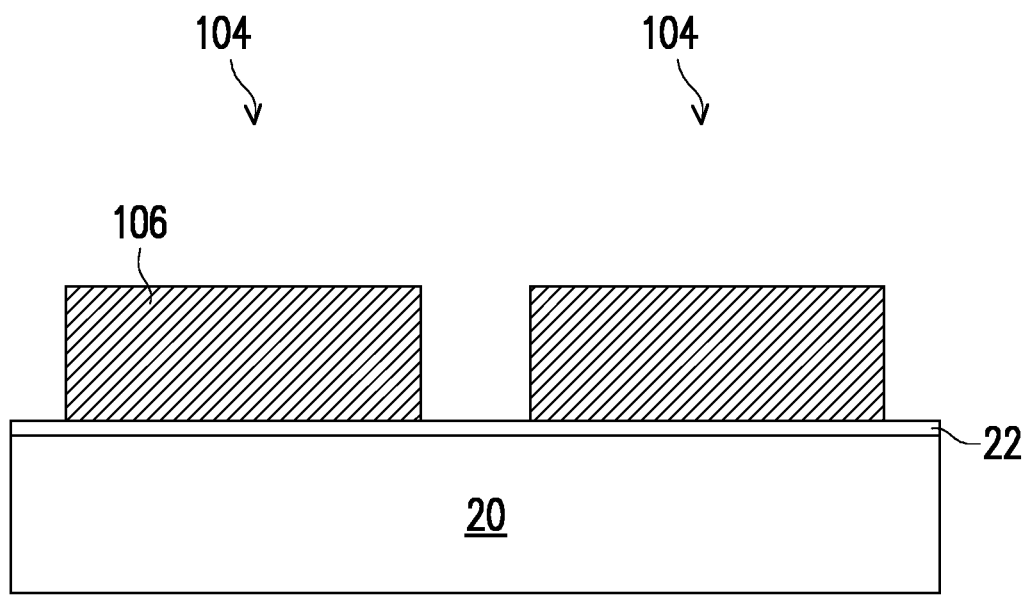

Referring to FIGS. 8A and 8B, after the plating of coils 104, photo resist 26 is removed. The portions of seed layer 24 (FIG. 5) that were previously covered by photo resist 26 are exposed. An etch step is then performed to remove the exposed portions of seed layer 24, wherein the etching may be an anisotropic or isotropic etching. The portions of seed layer 24 that are overlapped by coil 104, on the other hand, are not etched. Throughout the description, the remaining underlying portions of seed layer 24 are considered as being the bottom portions of coil 104. When seed layer 24 is formed of a material similar to or the same as that of the respective overlying coil 104, seed layer 24 may be merged with coil 104 with no distinguishable interface between the two. Accordingly, seed layers 24 are not shown in FIGS. 8A and 8B or in subsequent drawings. In accordance with alternative embodiments of the present disclosure, there exist distinguishable interfaces between seed layer 24 and the overlying plated portions of coil 104.

Figure 9A:
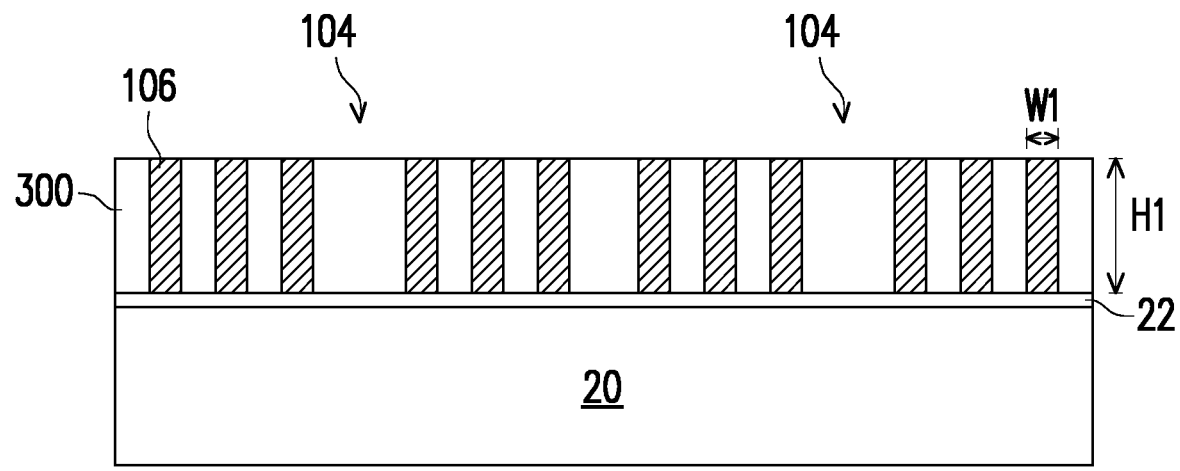
Figure 9B:
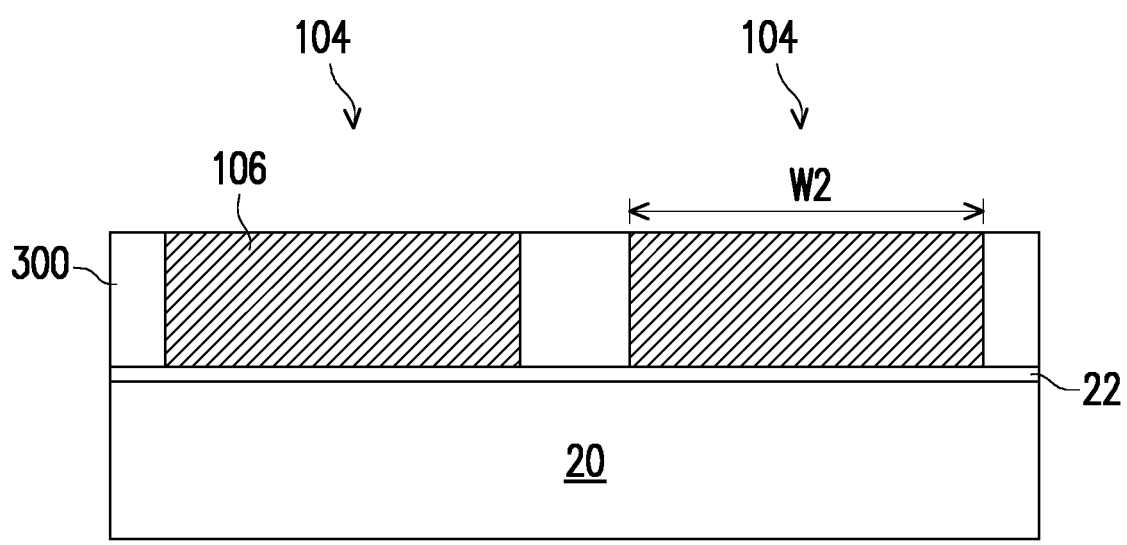

Next, referring to FIGS. 9A and 9B, encapsulating material 300 is encapsulated (sometimes referred to as molded) on coil 104. Encapsulating material 300 fills the gaps between neighboring portions of coil 104. Encapsulating material 300 may include a polymer-based material, and may include a molding compound, a molding underfill, an epoxy, and/or a resin. In some embodiments, encapsulating material 300 is formed on coil 104 using compression molding, transfer molding, or the like. The encapsulating material 300 may be dispensed in liquid form. Subsequently, a curing step may be performed to cure the encapsulating material 300, wherein the curing may be a thermal curing, a UV curing, the like, or a combination thereof. In other embodiments, a lamination process may be employed to form the encapsulating material 300.

After being encapsulated, the top surface of encapsulating material 300 is higher than the top ends of coil 104. Encapsulating material 300 may include an epoxy-based material and fillers in the epoxy-based material. The fillers may be spherical particles having the same diameter or different diameters. The fillers may be formed of silica (amorphous $SiO_2$), dry-ground micritic limestone, for example.

In a subsequent step, a planarization process such as a Chemical Mechanical Polish (CMP) process or a mechanical grinding process is performed to reduce the top surface of encapsulating material 300, until conductive elements 106 are exposed. Due to the planarization, the top ends of conductive elements 106 are substantially level (coplanar) with the top surfaces of encapsulating material 300. In accordance with some embodiments, after the planarization, height H1 (FIG. 9A) of conductive element 106 is in the range between about 50 μm and about 200 μm, and width W1 of conductive elements 106 is in the range between about 100 μm and about 200 μm. The ratio of width W1/H1 may be in the range between about 0.5 and about 1. In accordance with some embodiments, after the planarization, width W2 (FIG. 9B) of conductive element 106 is in the range between about 15 μm and about 20 μm.

Figure 10A:
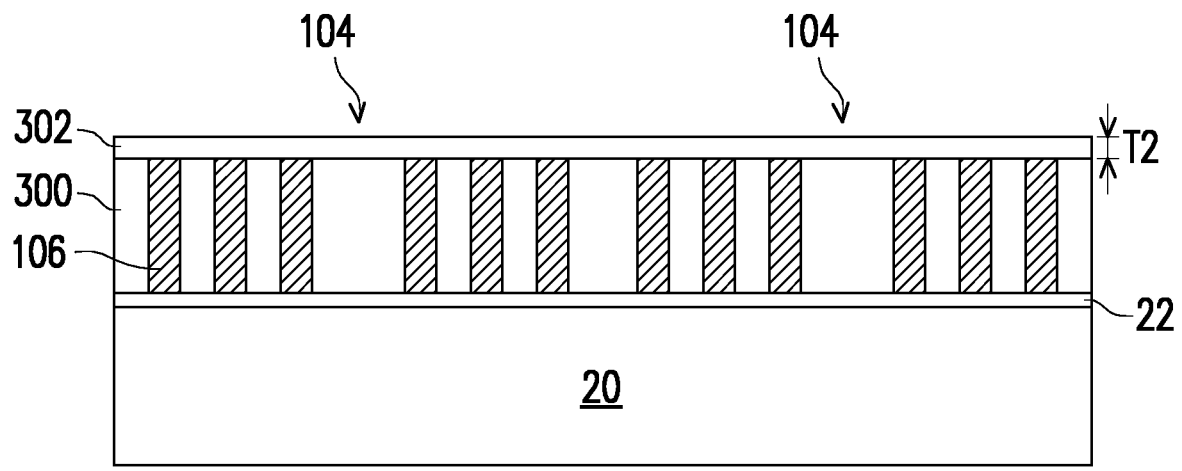
Figure 10B:
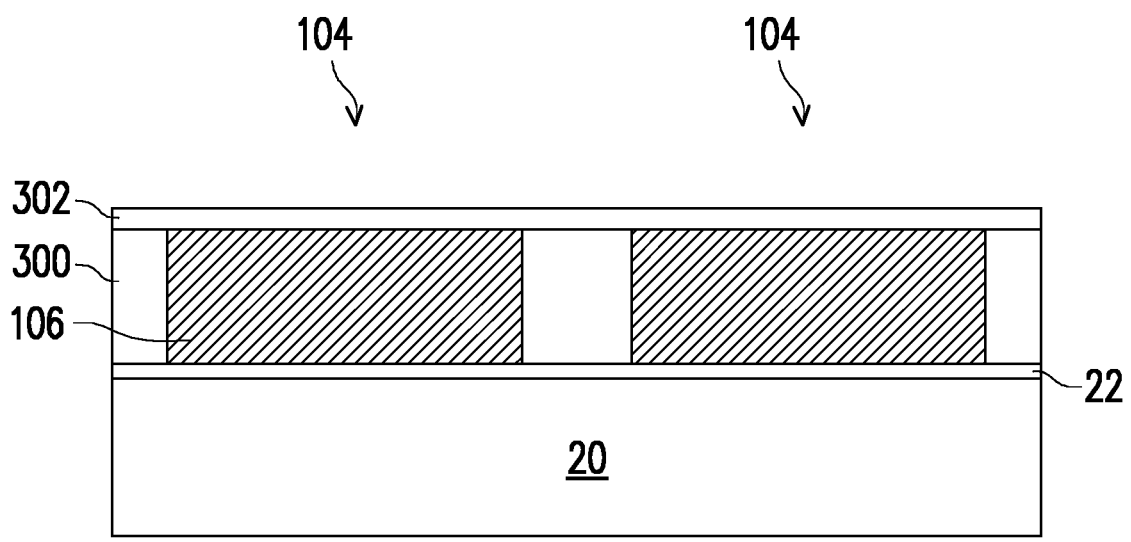

FIGS. 10A and 10B depict the forming of a dielectric layer 302. Dielectric layer 302 may be used as a passivation layer to isolate the underlying metallic features from the adverse effect of moisture and other detrimental substances. Dielectric layer 302 may be formed of a polymer, which may also be a photo-sensitive material such as polybenzoxazole (PBO), polyimide, benzocyclobutene (BCB), or the like. In some embodiments, dielectric layer 302 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 302 may be formed, for example, by spin coating, lamination, Chemical Vapor Deposition (CVD), or the like. In some embodiments, dielectric layer 302 is a planar layer having a uniform thickness, wherein the thickness T2 may be between about 3 μm and about 10 μm. The top and the bottom surfaces of dielectric layer 302 are also planar.

Figure 11A:
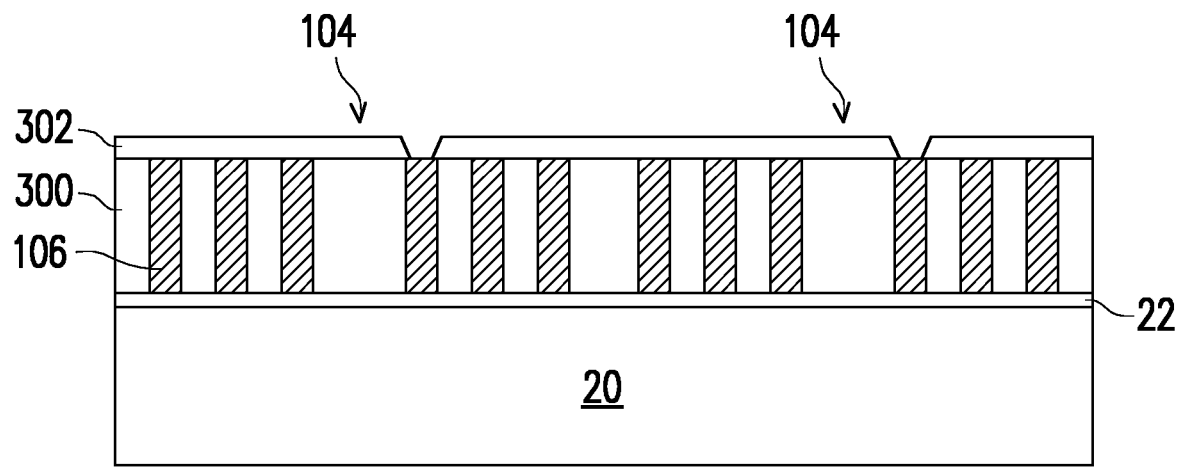
Figure 11B:
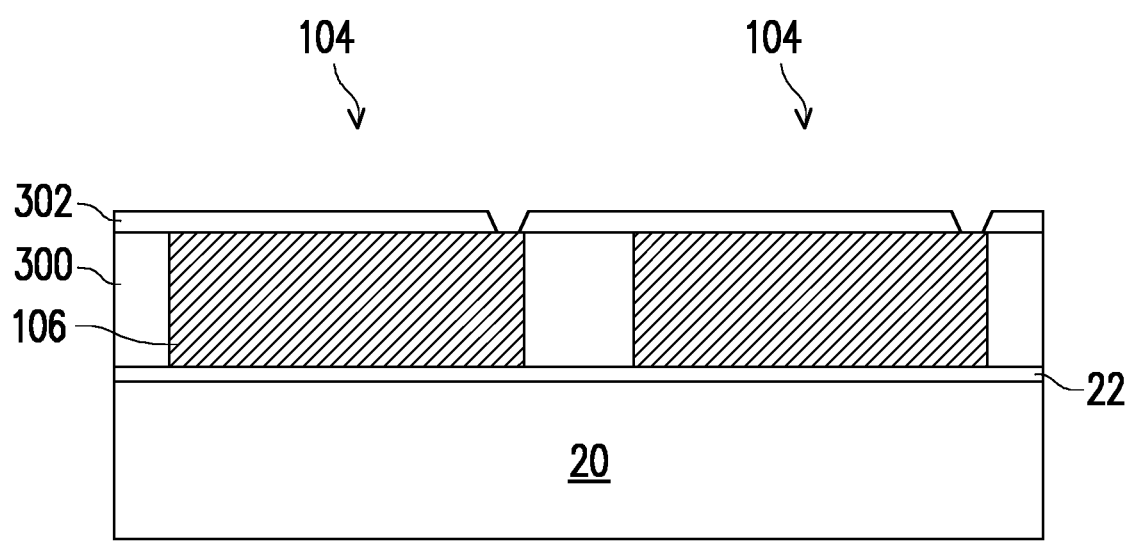

Referring to FIGS. 11A and 11B, dielectric layer 302 is patterned to expose the underlying conductive element 106 of each coil 104. For example, dielectric layer 302 may be patterned using photolithography. In some embodiments, dielectric layer 302 may be patterned by forming and patterning a photoresist layer using the same or similar processes described above, and etching the sections of dielectric layer 302 that are exposed through openings in the photoresist layer.

Figure 12A:
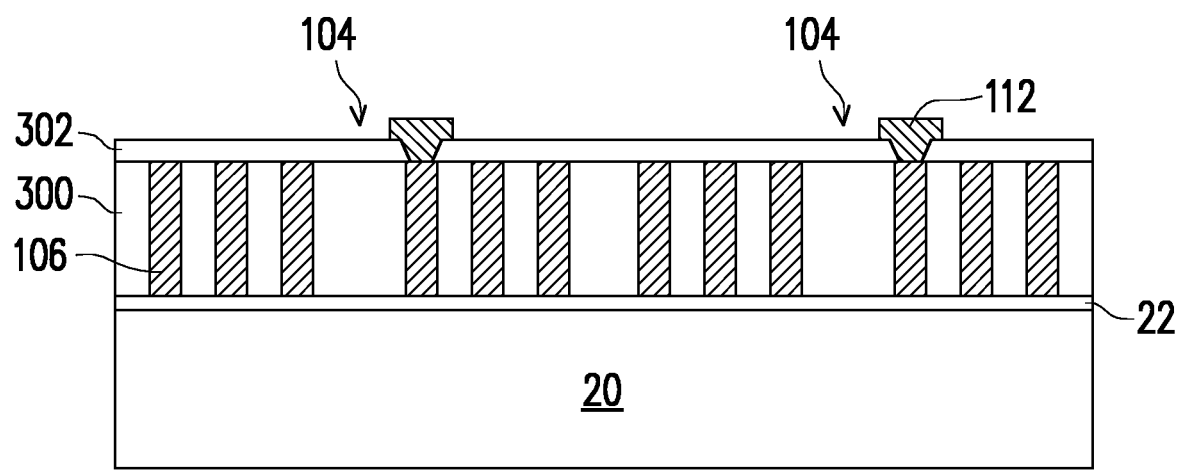
Figure 12B:
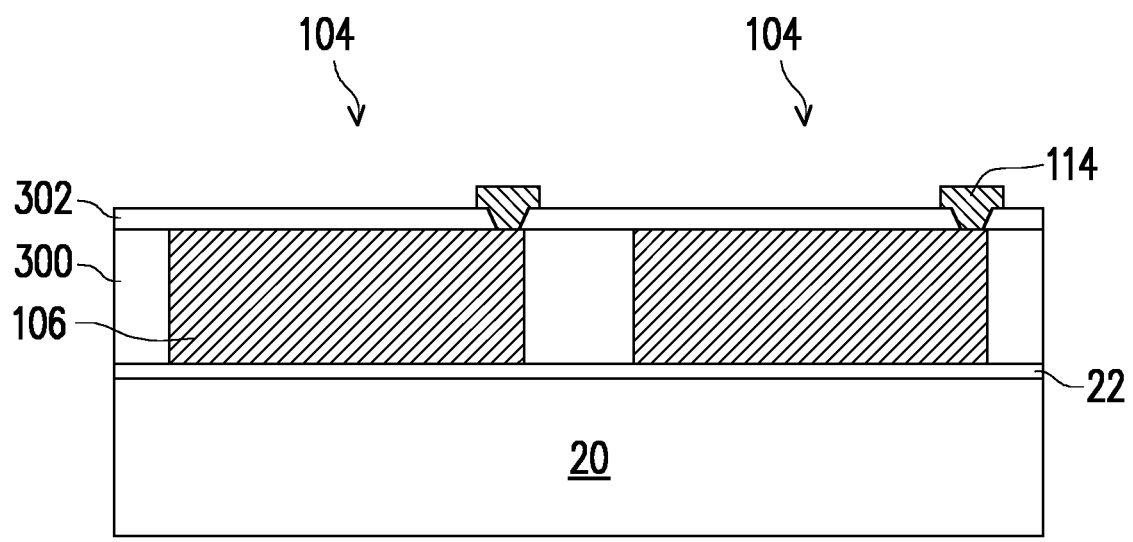

Next, as depicted in FIGS. 12A and 12B, electrical connectors 112 and 114 are formed overlying dielectric layer 302. Electrical connectors 112 and 114 electrically connect conductive element 106 to an external electrical circuit, such as the power-transmitting circuit 202 or power receiving circuit 204 of FIG. 2. In some embodiments, electrical connectors 112 and 114 respectively comprise an under bump metallization (UBM) formed and patterned over conductive elements 106 in accordance with some embodiments, thereby forming an electrical connection with conductive elements 106. The UBM provides an electrical connection upon which an electrical connector, e.g., a solder ball/bump, a conductive pillar, or the like, may be placed. In an embodiment, the UBM includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, the UBM is formed using sputtering. In other embodiments, electro plating may be used.

Electrical connectors 112 and 114 may also respectively comprise connectors over the UBM. The connectors may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors may include a conductive material such as solder, copper, aluminum, gold, nickel, silver, palladium, tin, the like, or a combination thereof. In some embodiments, the connectors comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. In some embodiments, a reflow process may be performed, giving the connectors a shape of a partial sphere in some embodiments. Alternatively, the connectors may comprise other shapes. The connectors may also comprise non-spherical conductive connectors, for example.

In some embodiments, the connectors comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 13A:
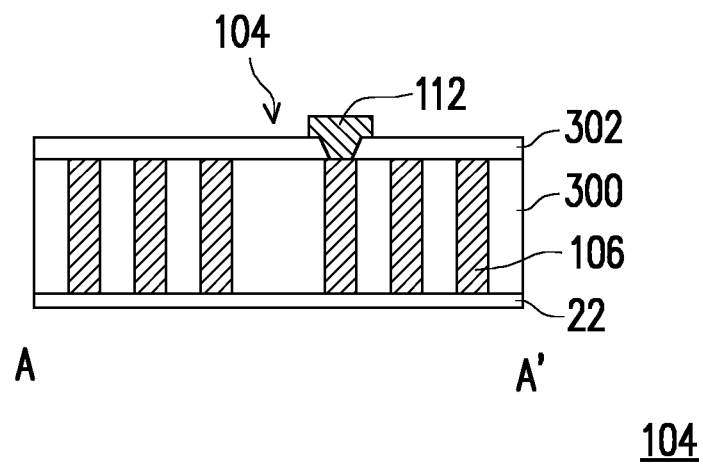
Figure 13B:
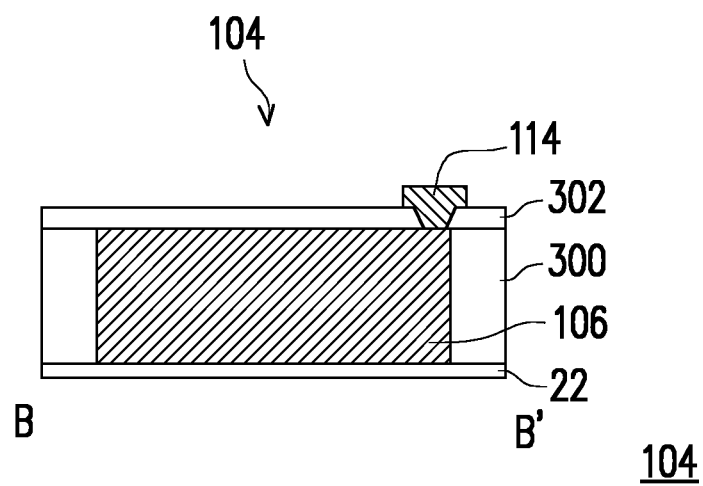

Referring to FIGS. 13A and 13B, the plurality of coils 104 that were formed together on carrier substrate 20 (FIG. 5) may be singulated into individual coils 104, for example using a laser grooving process. Each coil 104 may be de-bonded from carrier substrate 20. The resulting structures are depicted in FIGS. 13A and 13B. The coils 104 may be arranged on wafer 102 in a honeycomb pattern to form coil structure 100, as depicted in FIG. 1B. Electrical connectors 112 and 114 are connected to an external electrical circuit, such as the power transmitting circuit 202 or the power receiving circuit 204 shown in FIG. 2. In some embodiments, the plurality of coils 104 in coil structure 100 (depicted in FIG. 1B) are formed simultaneously and configured in the honeycomb pattern during formation of the coils 104.

Figure 14:
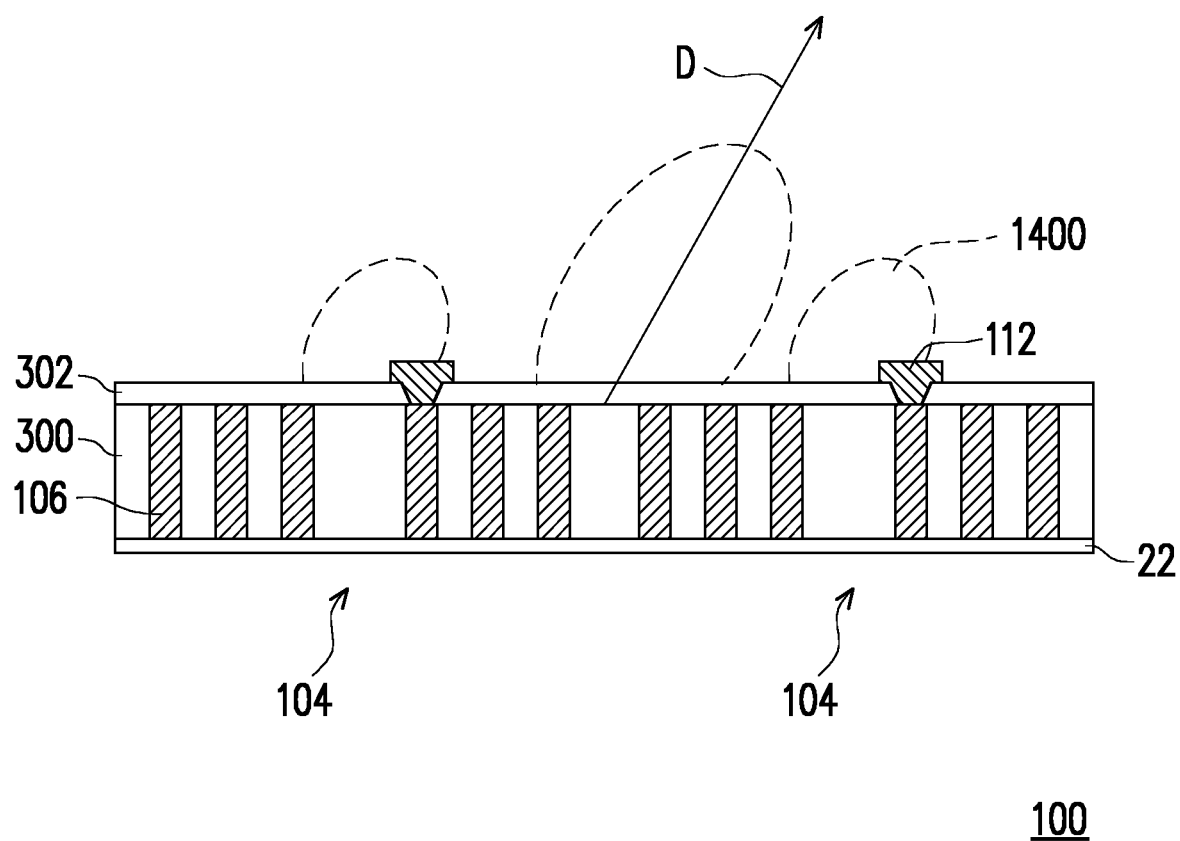
FIG. 14 is a cross section diagram of a coil structure in accordance with some embodiments.

Referring to FIG. 14, a cross sectional diagram of coil structure 100 is depicted. In some embodiments, coil structure 100 may be used for wireless charging. In some embodiments, more efficient wireless charging may be achieved if the magnetic field 1400 generated by the coil structure 100 can be focused in a particular desired direction D, instead of radiating equally in all directions from the points of generation. Direction D may be a direction of a receiving coil, and the receiving coil may be coupled to an electrical circuit that is configured to charge a battery. In some embodiments, the ability to focus the magnetic field 1400 generated by coil structure 100 may be achieved by using a plurality of coils 104 in coil structure 100. The magnetic field 1400 may be focused in a particular direction D by controlling an electrical current in the conductive element 106 in each coil 104. For example, the Ampere's circuital law provides that a magnetic field is an integrated function of an electrical current. Therefore, by controlling a frequency and amplitude of an electrical current in coils 104, a phase of the magnetic field can be controlled.

In some embodiments, using a larger number of coils 104 in coil structure 100 may lead to increased control of the magnetic field 1400 that is generated by coil structure 100. In some embodiments, more efficient wireless charging may therefore be achieved by using a larger number of coils 104 in coil structure 100. In some embodiments, forming coils 104 to each have a hexagonal shape, as shown in FIGS. 1A and 1B, and arranging the coils 104 in a honeycomb pattern, may enable a larger number of coils to be formed in coil structure 100 as compared to other shapes of coils that could be used, such as a square shape. Therefore, in some embodiments, forming coils 104 to have hexagonal shapes may enable better directional control of the magnetic field 1400 that is generated by coil structure 100 and may enable more efficient wireless charging.

In the embodiments depicted in FIGS. 1-14, each coil 104 is formed to have a hexagonal shape. As described above, the hexagonal shape of coil 104 may enable the formation of a large number of coils with a symmetric structure, which may allow a magnetic field that is created to be focused in a desired direction by controlling electrical currents in the coils. In some embodiments, other polygon shapes may be used. For example, in some embodiments coils 104 may have an octagon shape. In some embodiments, coils 104 may have a polygon shape with n number of sidewalls. In some embodiments, n is even integers that are greater than 4.

Figure 15:
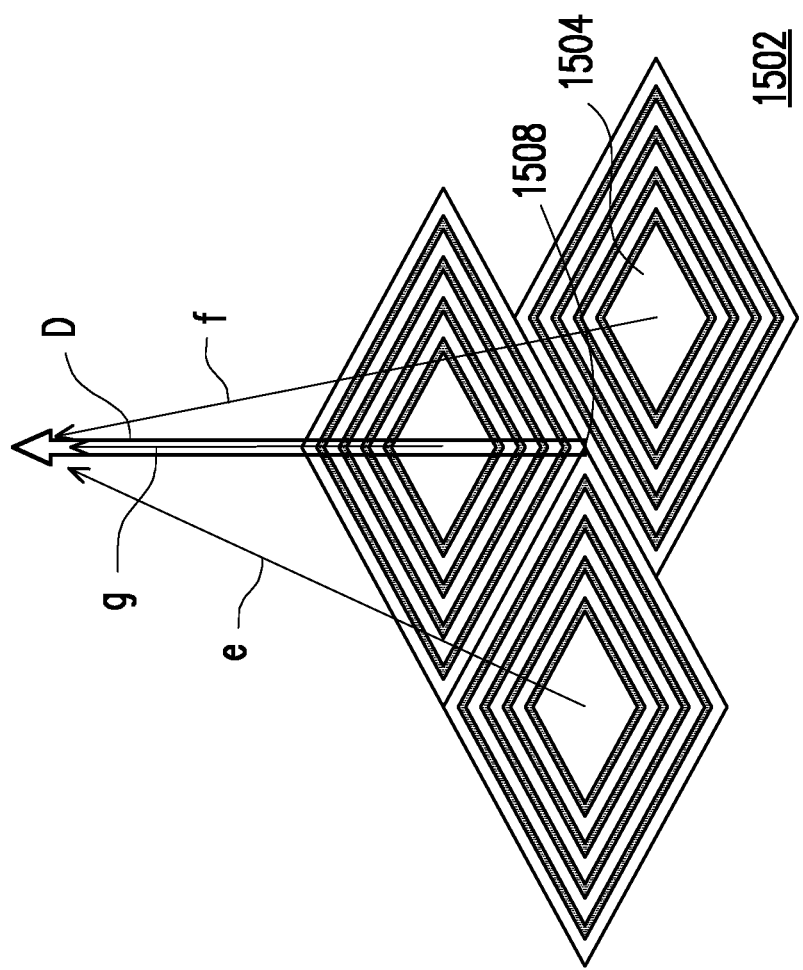
FIG. 15 are plan views of a coil structures in accordance with some embodiments.
Figure 15:
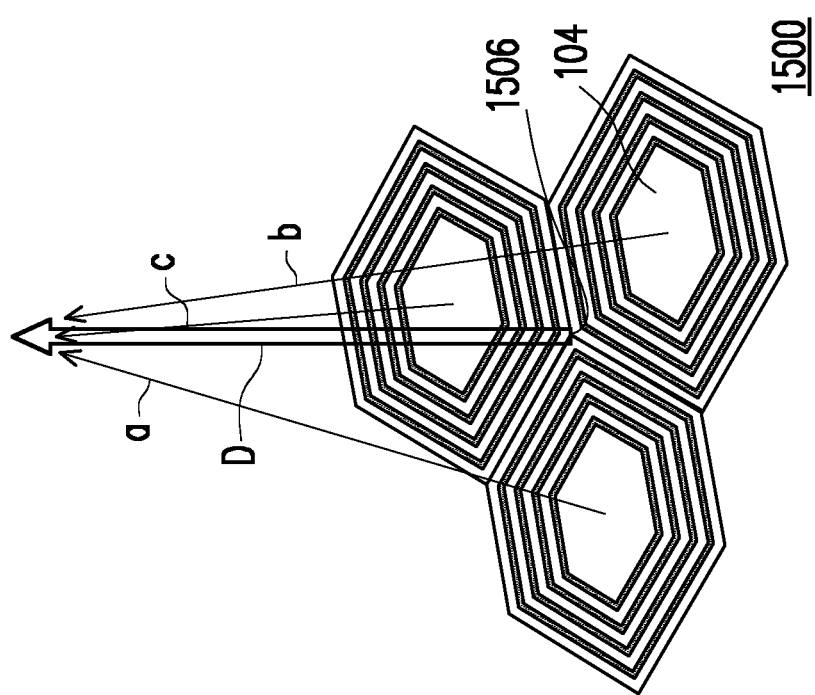

FIG. 15 depicts a perspective view of a two different coil structures 1500 and 1502. Coil structure 1500 comprises three coils 104 that have hexagonal shapes. Coil structure 1502 comprises three coils 1504 that have square shapes. In each coil structure, it is desired to focus the generated magnetic field in the direction D. For coil structure 1500, direction D extends along a straight line that is perpendicular to the plane in which the coils 104 are formed, and extends from a point 1506 that is equidistant to each adjacent coil 104. For coil structure 1502, direction D extends along a straight line that is perpendicular to the plane in which the coils 1504 are formed, and extends from a point 1508 that is equidistant to each adjacent coil 104.

In order to control the coil structures 1500 and 1502 to respectively focus a generated magnetic field in respective directions D, virtual distances a, b, and c, and e, f, and g, are respectively calculated. Virtual distances a, b, and c are virtual straight lines that extend from a center point of each coil 104 to a same point that lies on direction D of coil structure 1500. Virtual distances e, f, and g are virtual straight lines that extend from a center point of each coil 1504 to a same point that lies on direction D of coil structure 1502. Regarding coil structure 1500, due to the hexagonal shapes of coils 104, virtual distances a, b, and c are symmetrical in length. Regarding coil structure 1502, due to the square shape of coils 1504, virtual distances e, f, and g are not symmetrical and may have different lengths. For example, as shown in FIG. 15, in coil structure 1502 distances e and g are equivalent in length, but distance f has a different length than distances e and g. Due to symmetrical nature of coil structure 1500, coil structure 1500 may be more flexible in terms of the ability to adjust the electrical current in coils 104 to focus the magnetic field generated by coil structure 1500 along direction D. Due to the asymmetrical nature of coil structure 1502, coil structure 1502 may be less flexible in terms of the ability to adjust the electrical current in coils 1504 to focus the magnetic field generated by coil structure 1502 along direction D.

As described here, in some embodiments, a coil structure may be used in connection with wireless charging. For example, a coil structure may generate a magnetic field which is applied to another coil structure and then converted into electrical energy for charging a battery. In some embodiments, the use of a plurality of coils in the coil structure, instead of a single coil, may enable the magnetic field that is created to be focused in a desired direction by controlling the electrical current in the coils, which may enable more efficient wireless charging. In some embodiments, the use of a hexagonal coil shape, and arranging the plurality of coils in a honeycomb pattern, may enable a larger number of coils to be used. In some embodiments, an increased number of coils in the coil structure may enable greater flexibility in the ability to focus the magnetic field that is created in a desired direction. Also, in some embodiments a coil structure comprising hexagonal coils arranged in a honeycomb pattern may have increased symmetry, which may also enable greater flexibility in the ability to focus the magnetic field that is created in a desired direction.

According to some embodiments, a method of forming a coil structure is provided. The method includes forming a first conductive element on a wafer, the first conductive element forming a first continuous spiral having a hexagonal shape in a plan view of the first conductive element. The method also includes forming a second conductive element on the wafer, the second conductive element forming a second continuous spiral having a hexagonal shape in a plan view of the second conductive element. The method also includes encapsulating the first conductive element and the second conductive element in an encapsulating material. The method also includes forming a dielectric layer overlying the encapsulating material. The method also includes forming a first plurality of electrical connectors in the dielectric layer, the first plurality of electrical connectors being electrically connected to the first conductive element. The method also includes forming a second plurality of electrical connectors in the dielectric layer, the second plurality of electrical connectors being electrically connected to the second conductive element.

According to some embodiments, a method is provided. The method includes forming a plurality of coils, each coil comprising a conductive element that forms a hexagonal shape in a plan view. The method also includes encapsulating each coil in an encapsulating material and arranging the plurality of coils on a wafer in a symmetric array.

In accordance with some embodiments, a system is provided. The system includes a substrate and a plurality of coils disposed over the substrate, each coil comprising a conductive element that forms a continuous spiral having a hexagonal shape in a plan view of the coil. The plurality of coils is arranged on the substrate in a honeycomb pattern. The system also includes a plurality of electrical connectors. Two or more of the plurality of the electrical connectors are disposed over each of the plurality of coils.

In accordance with some embodiments, a system is provided. The system includes a substrate and a plurality of coils over the substrate. Each coil includes a conductive element that forms a continuous spiral having a hexagonal shape in a plan view of the plurality of coils. The plurality of coils are arranged on the substrate in a honeycomb pattern. The system further includes a plurality of electrical connectors. Two or more of the plurality of the electrical connectors are over each of the plurality of coils.

In accordance with some embodiments, a device is provided. The device includes a substrate and a first coil, a second coil and a third coil over the substrate. Each of the first coil, the second coil and the third coil includes a conductive element that forms a continuous spiral having a hexagonal shape in a plane parallel to a major surface of the substrate. The first coil, the second coil and the third coil are configured to generate a magnetic field in a first direction. The first direction extends along a first line. The first line is perpendicular to the major surface of the substrate and extends from a point that is equidistant to each of the first coil, the second coil and the third coil.

In accordance with some embodiments, a device is provided. The device includes a substrate, a molding compound over the substrate, and a plurality of coils embedded into the molding compound. Each coil includes a conductive element that forms a continuous spiral having a hexagonal shape in a plane parallel to a major surface of the substrate. The plurality of coils are arranged on the substrate in a honeycomb pattern. A top surface of each coil is level with a top surface of the molding compound. The device further includes an insulating layer over the molding compound and the plurality of coils, and a plurality of electrical connectors extending through the insulating layer and electrically contacting the plurality of coils.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a first insulating layer comprising a first material;
a plurality of coils embedded in the first insulating layer, each coil of the plurality of coils comprising a conductive element that forms a continuous spiral having a hexagonal shape in a plan view of the plurality of coils, wherein a minimum distance between adjacent coils of the plurality of coils is between 200 μm and 250 μm, and wherein the plurality of coils are arranged in a honeycomb pattern;
a first dielectric layer on a first surface of the first insulating layer; the first dielectric layer comprising a second material different than the first material;
a second dielectric layer on a second surface of the first insulating layer, the second dielectric layer being in physical contact with the plurality of coils, the second dielectric layer comprising the second material; and
a plurality of electrical connectors extending through the second dielectric layer and electrically contacting the plurality of coils, wherein widths of the plurality of electrical connectors decrease as the plurality of electrical connectors extend through the second dielectric layer toward the plurality of coils.

2. The system of claim 1, wherein the first dielectric layer and the second dielectric layer are made of a same material.

3. The system of claim 1, wherein the plurality of coils is in physical contact with the first dielectric layer.

4. The system of claim 1, wherein a portion of the continuous spiral is spaced apart from an inner adjacent portion of the continuous spiral by a distance in a range of 100 μm to 150 μm.

5. The system of claim 1, wherein the plurality of electrical connectors is electrically coupled to a circuit for charging a battery.

6. The system of claim 1, wherein a first surface of the first insulating layer is level with a first surface of each coil of the plurality of coils, wherein a second surface of the first insulating layer is level with a second surface of each of the plurality of coils.

7. A device comprising:
a first dielectric layer comprising a first material;
a first coil, a second coil, and a third coil over the first dielectric layer, each of the first coil, the second coil and the third coil comprising a conductive element that forms a continuous spiral having a hexagonal shape in a plane parallel to a major surface of the first dielectric layer, wherein a minimum distance between the first coil and the second coil is between 200 μm and 250 μm, and wherein the first coil, the second coil, and the third coil are configured to generate a magnetic field in a first direction, the first direction extending along a first line, the first line being perpendicular to the major surface of the first dielectric layer and extending from a point that is equidistant to each of the first coil, the second coil, and the third coil;
a second dielectric layer over and in physical contact with the first coil, the second coil, and the third coil, wherein a bottommost surface of the second dielectric layer is above topmost surfaces of the first coil, the second coil, and the third coil, the second dielectric layer comprising the first material;
wherein the first coil, the second oil, and the third coil are embedded within a third dielectric layer, the third dielectric layer comprising a second material different than the first material; and
a plurality of electrical connectors extending through the second dielectric layer and electrically contacting the first coil, wherein widths of the plurality of electrical connectors decrease as the plurality of electrical connectors extend through the second dielectric layer.

8. The device of claim 7, wherein the first dielectric layer and the second dielectric layer are made of a same material.

9. The device of claim 7, wherein the third dielectric layer extends along sidewalls of first coil, the second coil, and the third coil, wherein a first surface of the third dielectric layer contacts the first dielectric layer, wherein a second surface of the third dielectric layer contacts the second dielectric layer.

10. The device of claim 7, wherein the conductive element has a first width and a first height, and wherein a ratio of the first width to the first height is between about 0.5 and about 1.

11. The device of claim 10, wherein the first height is between about 50 μm and about 200 μm.

12. The device of claim 7, wherein the first, second, and third coil lie in a common plane, and wherein a first virtual line having a first length extends from a center point of the first coil to a point that lies in a direction D from the common plane, and wherein a second virtual line having the first length extends from a center point of the second coil to the point that lies in the direction D from the common plane.

13. A device comprising:
a first insulating layer, the first insulating layer being made of a first material;
a molding compound over the first insulating layer, the first material of the first insulating layer being in physical contact with a bottom surface of the molding compound;
a plurality of coils embedded into the molding compound, each coil comprising a conductive element that forms a continuous spiral having a hexagonal shape in a plane parallel to a major surface of the molding compound, wherein the plurality of coils are arranged on the first insulating layer in a honeycomb pattern, and wherein a top surface of each coil is level with a top surface of the molding compound;
a second insulating layer over the molding compound and the plurality of coils, the second insulating layer being made of a second material, the second material of the second insulating layer being in physical contact with the top surface of the molding compound, the first material and the second material having a same composition; and
a plurality of electrical connectors extending through the second insulating layer and electrically contacting the plurality of coils, wherein widths of the plurality of electrical connectors decrease as the plurality of electrical connectors extend through the second insulating layer toward the plurality of coils.

14. The device of claim 13, wherein conductive elements of each coil are separated by a distance between about 100 μm and about 150 μm.

15. The device of claim 14, wherein the molding compound fills a space within each coil of the plurality of coils.

16. The device of claim 14, wherein each coil of the plurality of coils have a same spiral pattern.

17. The device of claim 13, wherein a bottom surface of each coil is level with the bottom surface of the molding compound.

18. The device of claim 13, further comprising a substrate, wherein the first insulating layer is over the substrate, wherein the substrate has an area between 15×15 mm$^2$ and 20×20 mm$^2$.

19. The system of claim 1, wherein the first insulating layer is comprised of a molding compound in which the plurality of coils is embedded.

20. The device of claim 7, further comprising a molding compound in which the first coil, the second coil, and the third coil are embedded.

* * * * *

UNITED STATES PATENT AND TRADEMARK OFFICE
CERTIFICATE OF CORRECTION

PATENT NO. : 11,996,227 B2
APPLICATION NO. : 18/065199
DATED : May 28, 2024
INVENTOR(S) : Tzu-Sung Huang et al.

It is certified that error appears in the above-identified patent and that said Letters Patent is hereby corrected as shown below:

In the Claims

In Column 12, Line 1, Claim 7:
Change "wherein the first coil, the second oil, and the third coil are" to --wherein the first coil, the second coil, and the third coil are--

Signed and Sealed this
Ninth Day of July, 2024

Katherine Kelly Vidal
*Director of the United States Patent and Trademark Office*